United States Patent [19]

Engheta et al.

[11] Patent Number: 5,398,037
[45] Date of Patent: Mar. 14, 1995

[54] RADOMES USING CHIRAL MATERIALS

[75] Inventors: Nader Engheta, Strafford; Dwight L. Jaggard, Newtown Square, both of Pa.

[73] Assignee: The Trustees of the University of Pennsylvania, Philadelphia, Pa.

[21] Appl. No.: 6,698

[22] Filed: Jan. 21, 1993

Related U.S. Application Data

[63] Continuation of Ser. No. 637,450, Jan. 4, 1991, abandoned, which is a continuation-in-part of Ser. No. 362,072, Jun. 6, 1989, Pat. No. 5,063,391, and a continuation-in-part of Ser. No. 255,107, Oct. 7, 1988, abandoned.

[51] Int. Cl.$^6$ .......................... H01Q 1/40; H01Q 1/42; H01Q 15/00; H01Q 15/24
[52] U.S. Cl. .......................... 343/872; 343/753; 343/909; 343/873
[58] Field of Search .............. 343/872, 873, 909, 756, 343/911 R, 911 L, 753; H01Q 1/40, 1/42, 15/00, 15/02, 15/08–15/12, 19/00–19/02, 19/06–19/09

[56] References Cited

U.S. PATENT DOCUMENTS

| | | | |
|---|---|---|---|
| 2,049,588 | 8/1936 | Leib | 343/872 |
| 2,841,786 | 7/1958 | Dicke | 343/872 |
| 3,951,904 | 4/1976 | Tomonaga | 260/40 R |
| 4,333,082 | 6/1982 | Susman | 343/754 |
| 4,452,727 | 6/1984 | Frommer et al. | 252/518 |
| 4,456,548 | 6/1984 | Lewis et al. | 252/500 |
| 4,616,067 | 10/1986 | Lee et al. | 525/192 |
| 4,678,616 | 7/1987 | Tzeng | 428/551 |
| 4,948,922 | 8/1990 | Varadan et al. | 174/35 GC |

OTHER PUBLICATIONS

Chirosorb ™ As An Invisible Medium, Jaggard et al., Electronics Letters vol. 25, No. 3, Feb. 2, 1989, pp. 173, 174.
Lakhtakia et al., Radiation by a Point Electric Dipole Embedded in a Chiral Sphere Journal Physics D, vol. 23, May 14, 1990, pp. 481–485.
D. L. Jaggard et al., On Electromagnetic Waves in Chiral Media *Applied Physics*, vol. 18, pp. 211–216, 1979.
S. Bassiri et al., Dyadil Green's Function and Dipole Radiation in Chiral Media *Alta Frequenza*, No. 2, pp. 83–88, Mar, Apr.–1986.
N. Engheta et al., *IEEE Trans. on Ant. & Propag.*, vol. 37, No. 4, Apr., 1989, pp. 512–515.
S. Bassiri et al., EM Wave Propagation through a Dielectric–Chiral Interface and Through a Chiral Slab. *J. Opt. Soc. Am. A*, vol. 5, No. 9, pp. 1450–1459, Sep. 1988.
R. B. Kaner et al., "Plastics That Conduct Electricity," *Scientific American* (Feb. 1988).
A. Lakhtakia et al., "Scattering and Absorption Characteristics of Lossy Dielectric, Chiral, Non-Spherical Objects," *Applied Optics*, vol. 24, No. 23 (Dec. 1, 1985).
A. Lakhtakia et al., "A Parametric Study of Micro Reflection Characteristics of a Planar Achiral–Chiral Interface," *IEEE Transactions on Electromagnetic Compatibility*, vol. EMC–28, No. 2 (May 1986).
Varadan et al., "On the Possibility of Designing Antireflection Coatings Using Chiral Composites," *Journal of Wave Material Interaction*, vol. 2, No. 1 (Jan. 1987), pp. 71–81.
N. Engheta and P. Pelet, "Modes in Chirowaveguides," *Optics Letters*, vol. 14, No. 11 (Jun. 1, 1989).

*Primary Examiner*—Rolf Hille
*Assistant Examiner*—Peter Toby Brown
*Attorney, Agent, or Firm*—Duane, Morris & Heckscher

[57] ABSTRACT

Antenna structures and chiral radomes solve the aforementioned long-felt needs and provide efficient and multipolarized antenna structures and radomes. In a preferred embodiment, a radome for covering an antenna comprises a chiral medium. In a further preferred embodiment, a method of manufacturing an antenna structure comprising the step of embedding an antenna element in a radome which further comprises a chiral medium is also provided.

7 Claims, 10 Drawing Sheets

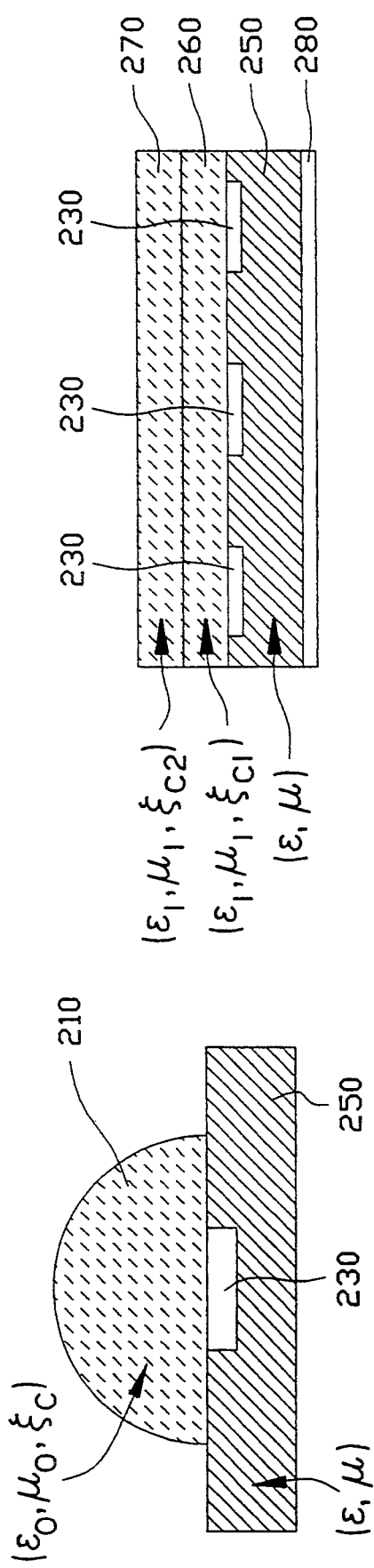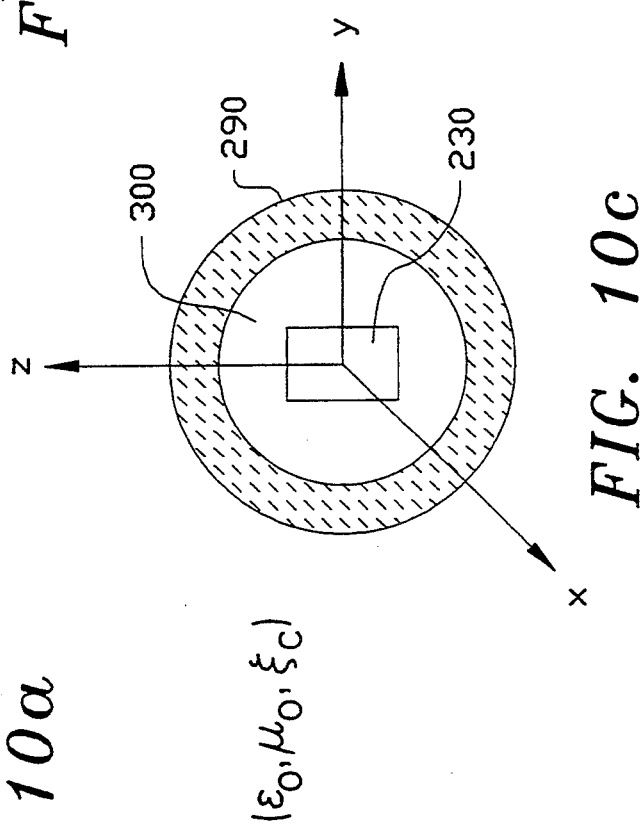
FIG. 10a
FIG. 10b
FIG. 10c

RADOMES USING CHIRAL MATERIALS

RELATED APPLICATIONS

This application is a continuation of U.S. Ser. No. 07/637,450, filed Jan. 4,1991, now abandoned; which is a continuation-in-part of 07/362,072, filed Jun. 6, 1989; now U.S. Pat. No. 5,063,391; and a continuation-in-part of U.S. Ser. No. 07/255,107, filed Oct. 7,1988, now abandoned.

FIELD OF INVENTION

Generally this invention relates to methods of constructing radome structures and antenna radomes. More specifically, this invention relates to antenna radomes comprising chiral materials.

BACKGROUND OF THE INVENTION

It has been shown that, for time-harmonic electromagnetic fields with exp(-iωt) excitation, a homogeneous, low loss, isotropic chiral (optically active) medium can be described electromagnetically by the following constitutive relations:

$$D = \epsilon E + i \xi_c B \quad (1)$$

$$H = i\xi E + (1/\mu) B \quad (2)$$

where E, B, D and H are electromagnetic field vectors and $\epsilon$, $\mu$, $\xi_c$ represent the dielectric constant, permeability and chirality admittance of the chiral medium, respectively. A "chiral medium" comprises chiral objects of the same handedness, randomly oriented and uniformly distributed. A chiral object is a three-dimensional body that cannot be brought into congruence with its mirror image by translation and rotation. Therefore, all chiral objects can be classified in terms of their "handedness." The term "handedness," as known by those with skill in the art, refers to whether a chiral object is "right-handed" or "left-handed." That is, if a chiral object is fight-handed (left-handed), its mirror image is left-handed (right-handed). Therefore, the mirror image of a chiral object is its enantiomorph.

Chiral media exhibit electromagnetic chirality which embraces optical activity and circular dichroism. Optical activity refers to the rotation of the plane of polarization of optical waves by a medium while circular dichroism indicates a change in the polarization ellipticity of optical waves by a medium. Them exists a variety of materials that exhibit optical activity. For example, for 0.63-μm wavelength, $TeO_2$ exhibits optical activity with a chirality admittance magnitude of $3.83 \times 10^{-7}$ mho. This results in a rotation of the plane of polarization of 87° per mm. These phenomena, known since the mid nineteenth century, are due to the presence of the two unequal characteristic wavenumbers corresponding to two circularly polarized eigenmodes with opposite handedness.

The fundamentals of electromagnetic chirality are known. See, e.g., J. A. Kong, *Theory of Electromagnetic Waves*, 1975; E. J. Post, *Formal Structure of Electromagnetics*, 1962. More recent work includes the macroscopic treatment of electromagnetic waves with chiral structures D. L. Jaggard et at. *Applied Physics*, 18, 211, 1979; the analysis of dyadic Green's functions and dipole radiation in chiral media, S. Bassiri et al. *Alta Frequenza*, 2, 83, 1986 and N. Engheta et al. *IEEE Trans. on Ant. & Propag.*, 37, 4, 1989; the reflection and refraction of waves at a dielectric-chiral interface, S. Bassiri et at. *J. Opt. Soc. Am.* A5, 1450, 1988; and guided-wave structures comprising chiral materials, N. Engheta and P. Pelet, *Opt. Lett.*, 14, 593, 1989. The following table compares the electromagnetic properties of chiral and nonchiral materials:

| Characteristics<br>Constitutive Relations | Simple Medium<br>$D = \epsilon E$<br>$H = (1/\mu)B$ | Chiral Medium<br>$D = \epsilon E + i\xi_c B$<br>$H = i\xi_c E + (1/\mu) B$ |
| --- | --- | --- |
| Wave Equation | $\nabla \times \nabla \times E - k^2 E = 0$ | $\nabla \times \nabla \times E - k^2 E - 2\omega\mu\xi_c \nabla \times E = 0$ |
| Wavenumbers | $k = \omega \sqrt{\mu\epsilon}$ | $k_\pm = \pm\omega\mu\xi_c + \sqrt{k^2 + (\omega\mu\xi_c)^2}$ |
| Eigenmodes | Linear Polarization Allowed | RCP and LCP Only |
| Wave Intrinsic Impedance | $\eta = \sqrt{\mu/\epsilon}$ | $\eta_c = \eta/\sqrt{1 + \eta^2\xi_c^2}$ |

Prior radomes have been known and used to protect antenna elements from the adverse effects of a harsh environment. Radomes have also been used to control the radiation cross-section ("RCS") parameters of antennas and antenna arrays that receive and transmit electromagnetic energy. Typically, prior radomes have been made of low loss dielectric materials which have been designed to have minimal interaction with the antennas found therein. However, prior radomes have been unable to efficiently and effectively provide control of radiation and scattering properties for antennas and antenna arrays both in low RCS applications and high efficiency antenna design. There therefore exists a long-felt need in the art for sophisticated and effective antenna radomes to provide sensitive radiation control and RCS management for low profile antennas.

SUMMARY OF THE INVENTION

Antenna structures and chiral radomes claimed and described herein solve the aforementioned long-felt needs and provide efficient and multipolarized antenna structures and radomes. In a preferred embodiment, a radome for covering an antenna comprises a chiral medium. Methods of manufacturing antenna structures provided in accordance with the present invention also solve the aforementioned long-felt needs. In a preferred embodiment, a method of manufacturing an antenna structure comprising the step of embedding an antenna element in a radome which further comprises a chiral medium is provided.

BRIEF DESCRIPTION OF THE DRAWINGS

FIGS. 10a through 10d are preferred embodiments of antenna structures comprising chiral radomes provided in accordance with the present invention.

DETAILED DESCRIPTION OF PREFERRED EMBODIMENTS

An exceedingly wide variety of chiral structures are amenable to the practice of this invention, so long as such structures exhibit an effective capacity to conduct electric current and have the same handedness. Chiral structures employable in the practice of this invention can be naturally-occurring or man-made. A preferred chiral structure is the single-turn wire helix given in FIG. 1, having total stem length 2l, loop radius a, and thickness t as noted therein.

Preferred materials for constructing helices include copper, gold, silver, iron, and aluminum. As will be appreciated by those skilled in the art, chiral structures can be produced, for example, by molding, extruding or otherwise shaping a suitable metal, alloy, polymer or other conducting structure. These chiral structures are embedded in a suitable host material which is generally constituted so as to contain the chiral moieties and to cause them to adhere to or form articles or coatings upon articles. Polymerizable materials such as acrylics, epoxies and the like are exemplary host materials. Other solidifiable materials may be used as well. Suitable host media comprise liquids, polymeric, polymerizable or otherwise solidifiable materials, and certain solids with varying degrees of loss. The chiral material may be homogeneous or may comprise chiral structures of varying size, shape, and constitution to provide broadband characteristics. Materials which can-be either naturally occuring or man-made may be employed. Chiral molecular species are also suitable in accordance with certain embodiments of the invention. Thus, natural or synthetic molecules or molecules having chirality introduced by electromagnetic forces may be used.

Chiral materials used in connection with the invention described and claimed herein can be described in accordance with the following examples:

EXAMPLES

Example 1—Construction of Helices

Figure 1:
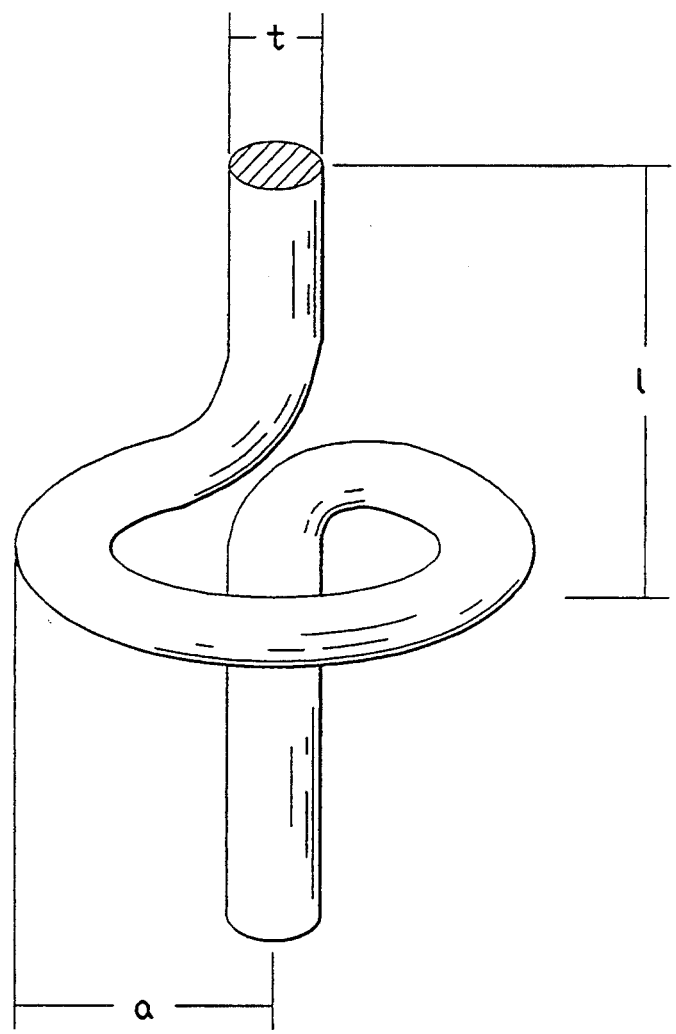
FIG.1 depicts a helix which is a preferred embodiment of a chiral structure used in the practice of the present invention.

Elemental copper having conductivity of about $5.0 \times 10^7$ mhos is drawn into cylindrically shaped wire having diameter (t) of about 0.1 millimeters. The wire is then shaped into single-turn helices having stem half-length (l) and loop radius (a) of about 3.0 millimeters, as shown in FIG. 1.

Example 2—Incorporation of Helices into a Lossy or Low-Loss Host Medium

The components of an ECCOSORB (Emerson and Cumming) lossy or low-loss host medium material preparation are mixed in an open-top, cardboard box having known internal volume. Before the preparation solidifies, an appropriate number of the copper helices constructed in Example 1 is uniformly added to reach the desired concentration (N) helices per square centimeter. The matrix is stirred well and allowed to fully solidify.

Derivation of The Radiation Characteristics of Antenna Arrays in Chiral Materials Using the time-harmonic Maxwell equations for both electric sources $J$ and $r$ and magnetic sources $J_m$ and $r_m$ yields $$\nabla \times E = i\omega B - J_m \tag{3}$$

$$\nabla \times H = J - i\omega D \tag{4}$$

$$\nabla \cdot B = \rho_m \tag{5}$$

$$\nabla \cdot D = \rho. \tag{6}$$

From these relations, the following inhomogeneous differential equations for the field quantities can be found with the aid of (1) and (2).

$$\Box_c^2 E = i\omega\mu[J - i\xi_c J_m] - \nabla \times J_m \tag{7}$$

$$\Box_c^2 H = i\omega\mu[i\xi_c J + J_m/\eta_c^2] + \nabla \times J \tag{8}$$

$$\Box_c^2 B = \mu\{\nabla \times [J + i\xi_c J_m] + i\omega\epsilon J_m\} \tag{9}$$

$$\Box_c^2 D = \mu\{i\omega\epsilon J + \nabla \times [i\xi_c J - J_m/\eta_c^2]\} \tag{10}$$

where the chiral differential operator is defined by the relation $$\Box_c^2 \{\} \equiv \nabla \times \nabla \times \{\} - 2\omega\mu\xi_c \nabla \times \{\} - k^2\{\} \tag{11}$$

and where $$\eta_c \equiv \eta_o \left[ \frac{1}{\sqrt{1 + \eta_o^2 \xi_c^2}} \right] \tag{12}$$

is a generalized chiral impedance with $\eta_o (=\sqrt{\mu/\epsilon})$ as the background intrinsic wave impedance. The introduction of both the chiral impedance by relation (12) and the chiral admittance through expressions (1)–(2) leads naturally to the definition of a dimensionless chirality factor k given by their product. Explicitly, $$\kappa = \eta_c \xi_c \tag{13}$$

where the absolute value of $\kappa$ is bounded by zero and unity. It is this parameter that is a quantitative measure of the degree of chirality of the medium and it is a measure of the chirality of a medium.

Since the fields E, B, D and H are linearly dependent on the current sources $J$ and $J_m$, these fields can be written in terms of integrals over the sources and an appropriately defined dyadic Green's function. Furthermore, these expressions can be simplified so that each field eigenmode, denoted by a "±" subscript is written in the simple form below.

$$E(x)_\pm = i\omega\mu \int \underline{\Gamma}^\pm(x,x') \cdot [J(x') \pm iJ_m(x')/\eta_c]dx' \quad (14)$$

$$H(x)_\pm = \frac{-i\omega\mu}{\eta_c} \int \underline{\Gamma}^\pm(x,x') \cdot (\pm i)[J(x') \pm iJ_m(x')/\eta_c]dx' \quad (15)$$

$$B(x)_\pm = -i\mu k_\pm \int \underline{\Gamma}^\pm(x,x') \cdot (\pm i)[J(x') \pm iJ_m(x')/\eta_c]dx' \quad (16)$$

$$D(x)_\pm = \frac{i\mu k_\pm}{\eta_c} \int \underline{\Gamma}^\pm(x,x') \cdot [J(x') \pm iJ_m(x')/\eta_c]dx', \quad (17)$$

where the dyadic Green's function $\underline{\Gamma}(x,x')$ is given below. Here boldface quantities denote vectors while underbars indicate dyads. It is noted that the total field quantities are the sum of the "+" and the "−" eigenmodes given in (14)–(17). Each eigenmode represents a circularly polarized wave of a given handedness.

The above-referenced dyadic Green's function $\underline{\Gamma}(x,x')$ can be rewritten in the compact form $$\underline{\Gamma}(x,x') = \underline{\Gamma}^+(x,x') + \underline{\Gamma}^-(x,x') = \beta\underline{\chi}^+(k_+)G_+(x,x') + [1-\beta]\underline{\chi}^-(k_-)G_-(x,x') \quad (18)$$

where the "+" and "−" superscripts refer to the first and second terms, respectively, on the right-hand side of (18) and the dyadic operators for the two eigenmodes are given in terms of the unit dyad $\underline{I}$ by $$\underline{\chi}^\pm(k_\pm) = \{\underline{I} \pm k_\pm^{-1}\underline{I} \times \nabla + k_\pm^{-2}\nabla\nabla\} \quad (19)$$

and where $$G_\pm(x,x') = \frac{\exp[ik_\pm|x-x'|]}{4\pi|x-x'|} \quad (20)$$

$$k_\pm = k_o[\sqrt{1+\eta_o^2\xi_c^2} \pm \eta_o\xi_c] = k_o\sqrt{1+\eta_o^2\xi_c^2}[1 \pm \kappa] \quad (21)$$

$$\beta = \frac{k_o^2 - k_+^2}{k_-^2 - k_+^2} = \frac{1}{2}[1+\kappa] \quad (22)$$

$$1 - \beta = \frac{k_o^2 - k_-^2}{k_+^2 - k_-^2} = \frac{1}{2}[1-\kappa]. \quad (23)$$

The wavenumbers $k_\pm$ are the propagation constants for the two eigenmodes ("+" and "−") supported by the medium. The factors $\beta$ and $1-\beta$ are denoted handedness factors. These quantities will play a role in the far-field radiation patterns of antennas and arrays and represent the relative amplitude of waves of each handedness. Here $k_o$ (=$\omega\sqrt{\mu\epsilon}$) is the host or background wavenumber of the achiral media with identical permittivity and permeability.

From a far-field expansion of the Green's dyad (18) the electric field eigenmodes corresponding to (14) can be written in the form $$E(x)_\pm \underset{kr\gg 1}{\Longrightarrow} i\omega\mu\left(\begin{array}{c}\beta\\1-\beta\end{array}\right)\frac{e^{ik_\pm r}}{4\pi r}[-\hat{e}_r\times\hat{e}_r\times \pm i\hat{e}_r\times]\int e^{-ik_\pm\hat{e}_r\cdot x'}[J(x') \pm iJ_m(x')/\eta_c]dx' \quad (24)$$

for general current sources where $r=|x|$, $\hat{e}_r$ is a unit vector along the position vector x. It is understood here and in the following equations that in the triple cross product involving $\hat{e}_r$ the cross products are carried out right to left. Likewise, using (15) it can be shown that the magnetic field in this limit is given by the relation $$H(x)_\pm \underset{kr\gg 1}{\Longrightarrow} \frac{i\omega\mu}{\eta_c}\left(\begin{array}{c}\beta\\1-\beta\end{array}\right)\frac{e^{ik_\pm r}}{4\pi r}[\hat{e}_r\times \pm i\hat{e}_r\times\hat{e}_r\times]\int e^{-ik_\pm\hat{e}_r\cdot x'}[J(x') \pm iJ_m(x')/\eta_c]dx' \quad (25)$$

Of particular note from (24)–(25) is that either eigenmode can be excited while the other is suppressed through the appropriate choice of electric and magnetic sources.

Figure 2B:
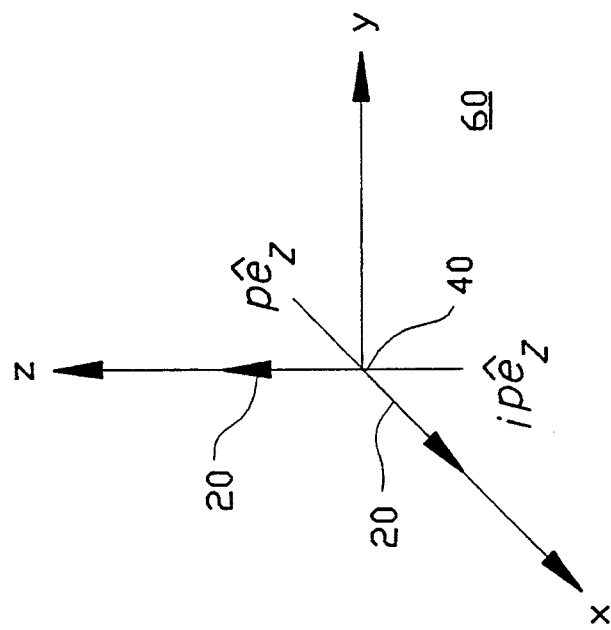
FIGS. 2A & 2B are illustrations
Figure 2A:
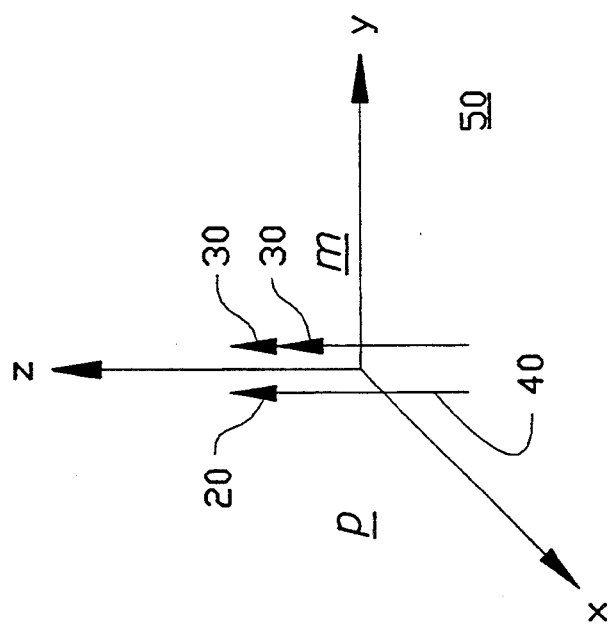

Referring now to the drawings wherein like reference numbers refer to like elements, FIG. 2 represents point arrays comprising electric and/or magnetic dipoles. In the far zone, the expression for the electric field eigenmodes due to a point electric dipole p and point electric magnetic dipole m located at the origin is immediately found from (24) with the relations $J(x') = -i\omega p\delta(x')$ and $J_m(x') = -i\omega\mu m\delta(x')$ as:

$$E(x)_\pm \underset{kr\gg 1}{\Longrightarrow} \omega^2\mu\left(\begin{array}{c}\beta\\1-\beta\end{array}\right)\{-\hat{e}_r\times\hat{e}_r\times[p \pm im/v_c] \pm i\hat{e}_r\times[p \pm im/v_c]\}\frac{e^{ik_\pm r}}{4\pi r} \quad (26)$$

with $v_c \equiv \eta_c/\mu \equiv [\sqrt{\mu\epsilon}\sqrt{1+\eta_o^2\xi_c^2}]^{-1}$ being the generalized chiral velocity. This expression teaches ways in which one or both of the eigenmodes of the medium can be excited or sensed. The two-element point arrays 50, in preferred embodiments, is formed by coincident parallel electric and magnetic dipoles 20 and 30. The turnstile antenna 60 is formed, in preferred embodiments, by two coincident orthogonal electric dipoles 20. These configurations are displayed in FIG. 2.

Consider the case of the parallel electric 20 and the magnetic dipole 30 in antenna array 50 located at the origin 40, preferably in a spheroid coordinate system (r, $\theta$, $\phi$). Two special cases are especially illuminating. Assume as the first special case the relation where the currents in the two dipoles are in phase and give rise to fields of equal magnitude. If $p = im/v_c = p\ e_z$, only the positive eigenmode is excited and the total electric field is found to be $$E(x) = E(x)_+ \underset{kr\gg 1}{\Longrightarrow} -2\sqrt{2}\ \omega^2\mu\beta p\sin\theta\frac{e^{ik_+r}}{4\pi r}\hat{e}_+ \quad (27)$$

while if $p = -im/v_c = p\ e_z$, only the negative eigenmode is excited and the result is $$E(x) = E(x)_- \underset{kr \gg 1}{=>} -2\sqrt{2}\ \omega^2\mu(1-\beta)p\sin\theta \frac{e^{ik-r}}{4\pi r}\hat{e} \tag{28}$$

for the total electric field where the circular polarization basis vectors are $e_{35} = (e\theta \pm e100)\sqrt{2}$ and the angle x axes, respectively. The sole excitation of a single eigenmode of the chiral medium is particular to the case where both electric and magnetic sources are present since this cannot be accomplished in chiral medium with only electric sources. Further, the far field is perfectly circularly polarized, regardless of direction. As in the the achiral case, however, the radiation pattern has the $\sin\theta$ dependance characteristic of all electrically small sources.

As the second special case, consider the case where the currents in the two dipoles are fed out of phase so that the moments are in phase and are given by $p = m/v_c = p\ e_z$. The far-zone electric field calculation using (26) yields an expression for both eigenmodes $$E(x)_\pm \underset{kr \gg 1}{=>} -\sqrt{2}\ \omega^2\mu \left(\frac{\beta}{1-\beta}\right) p(1 \pm i)\sin\theta \frac{e^{ik\pm r}}{4\pi r}\hat{e}_\pm \tag{29}$$

in a manner similar to that of the electric dipole alone. Here the total electric field is not circularly polarized but instead is elliptically polarized.

Figure 3:
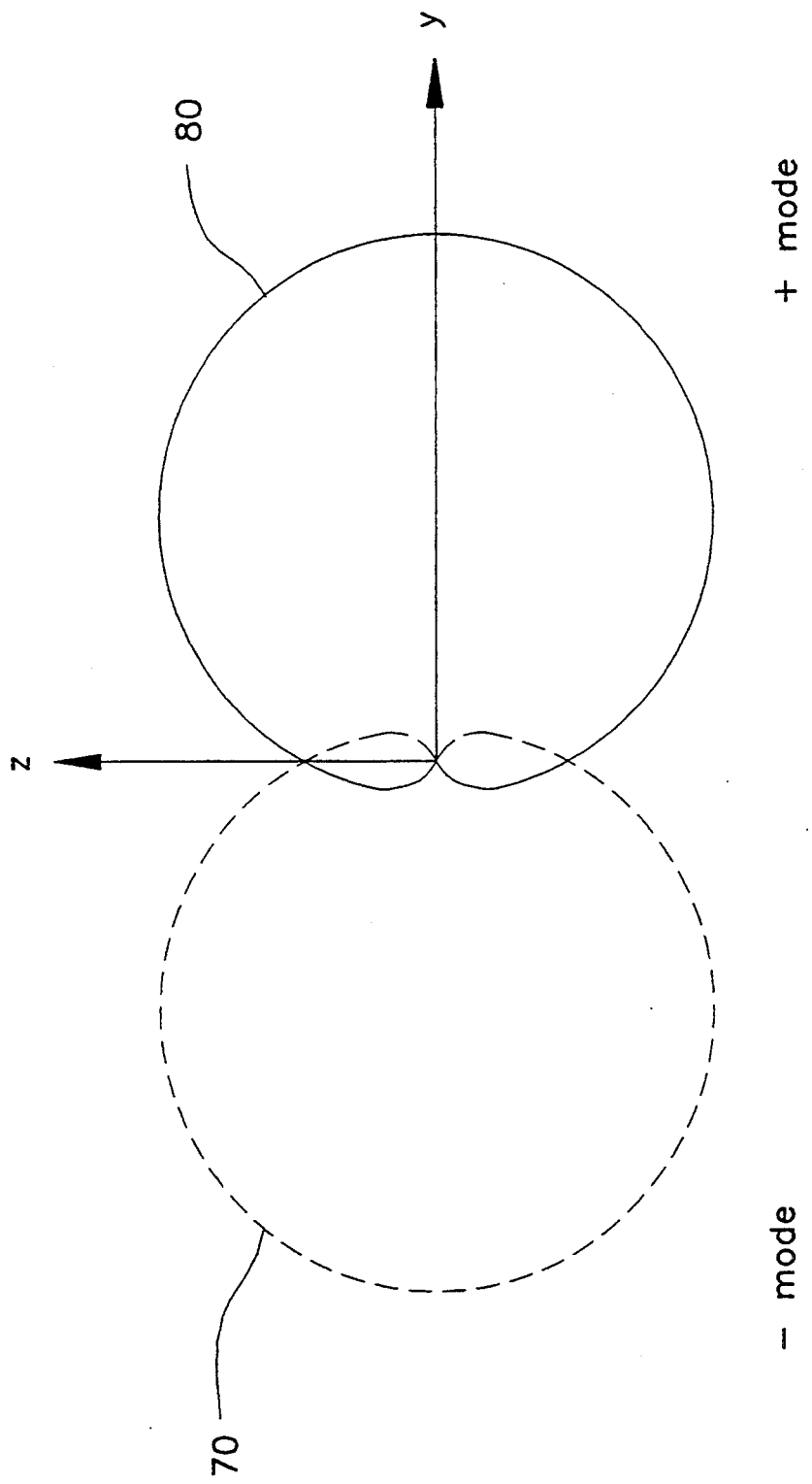
FIG. 3 is the radiation pattern of the turnstyle antenna of FIG. 2.

As the third case, consider the turnstyle antenna 60 where the electric current distribution is given by $J(x') = -i\omega p(e_z + ie_x)\delta(x')$. Using (26) the far-zone electric field exhibits the two circularly polarized eigenmodes as given by $$E(x)_\pm \underset{kr \gg 1}{=>} -\sqrt{2}\ \omega^2\mu \left(\frac{\beta}{1-\beta}\right) p \frac{e^{ik\pm r}}{4\pi \rho} [1 \pm \sin\theta\sin\phi]\hat{e}_\pm \tag{30}$$

where $e_{35}'$ denotes the right- and left-handed circular polarization vectors with rotated axes. These two eigenmodes possess considerably different angular dependences. Referring to FIG. 3, the two eigenmodes 70 and 80 of Equation (30) access two different half spaces divided by the plane of the turnstyle antennas 60. Therefore, in this case, each half space has essentially a circularly polarized wave of opposite handedness.

Figure 4:
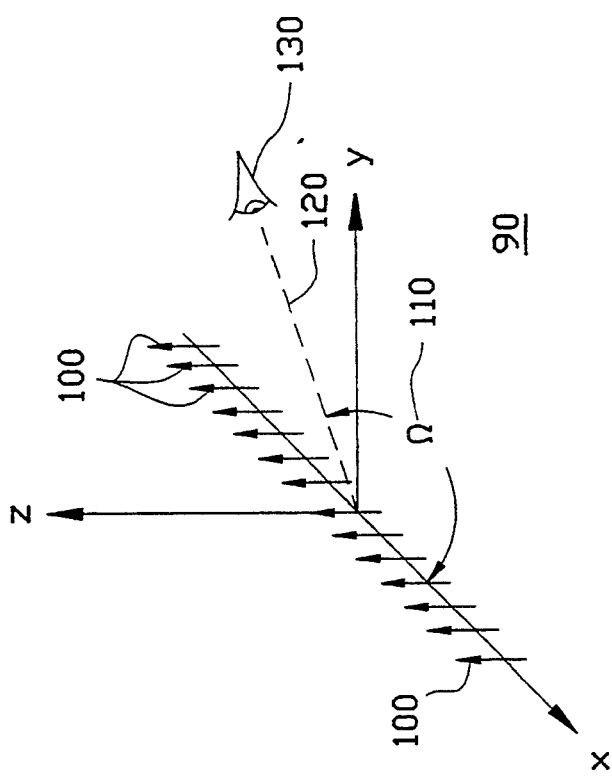
FIG. 4 is a linear array of N-element dipoles spaced a distance d apart alone the x axis.
Figure 5B:
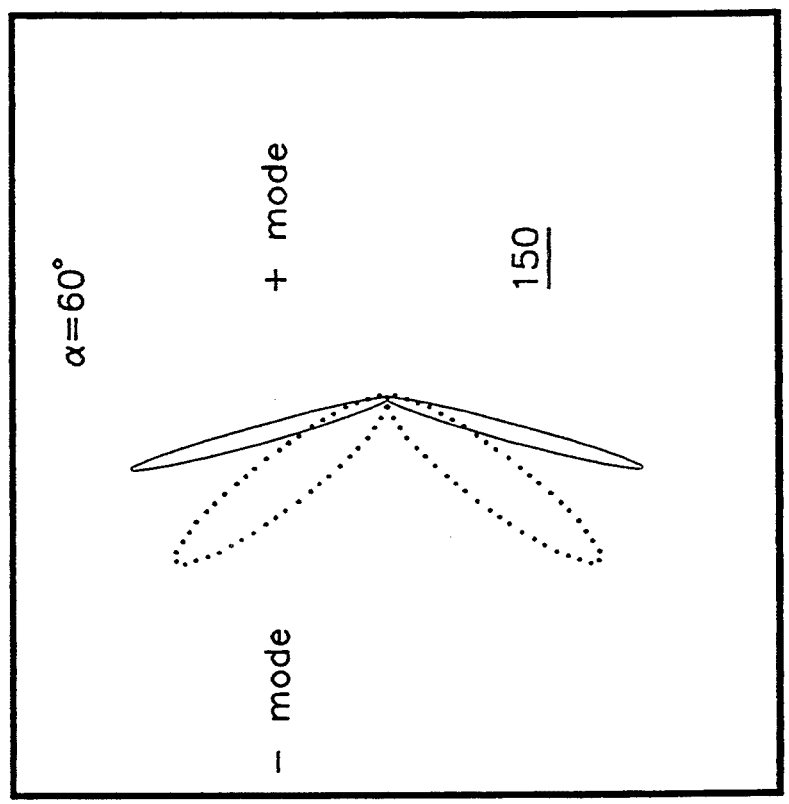
FIGS. 5A–5F are the radiation pattern of the linear array of FIG. 4 which illustrates beam splitting and mode suppression.
Figure 5A:
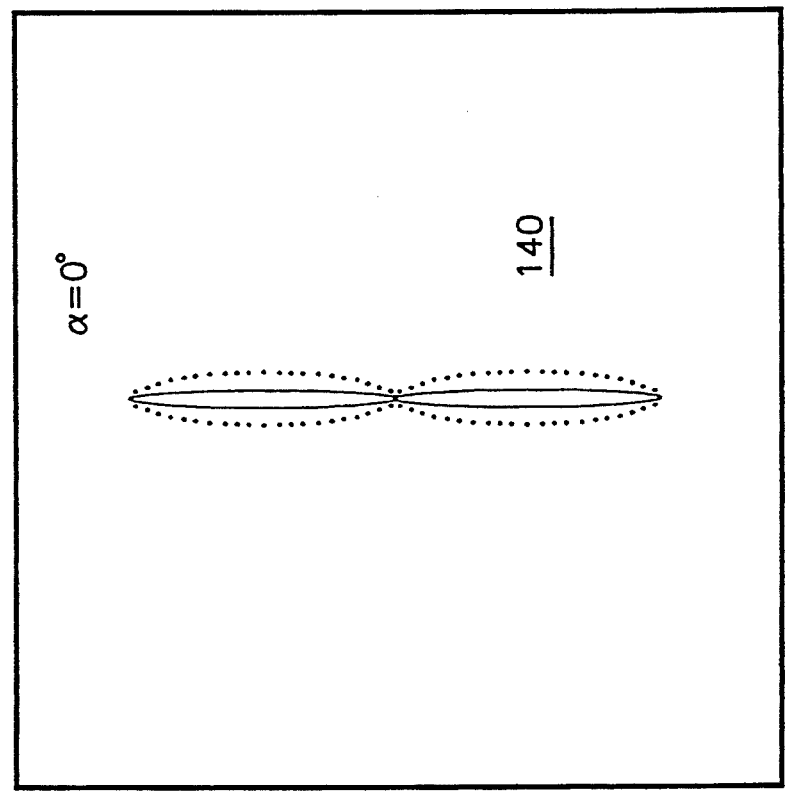
Figure 5D:
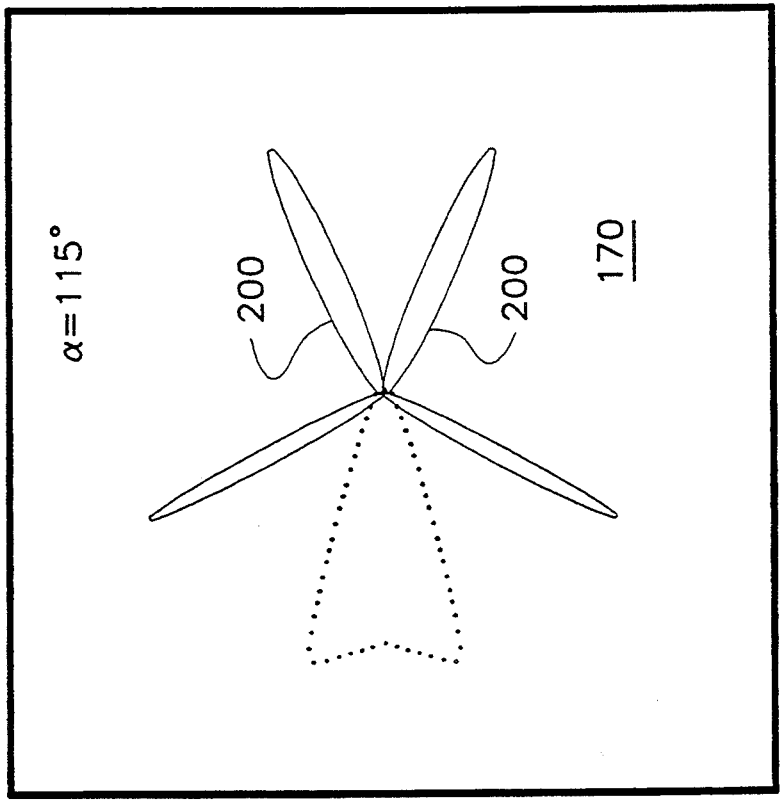
Figure 5C:
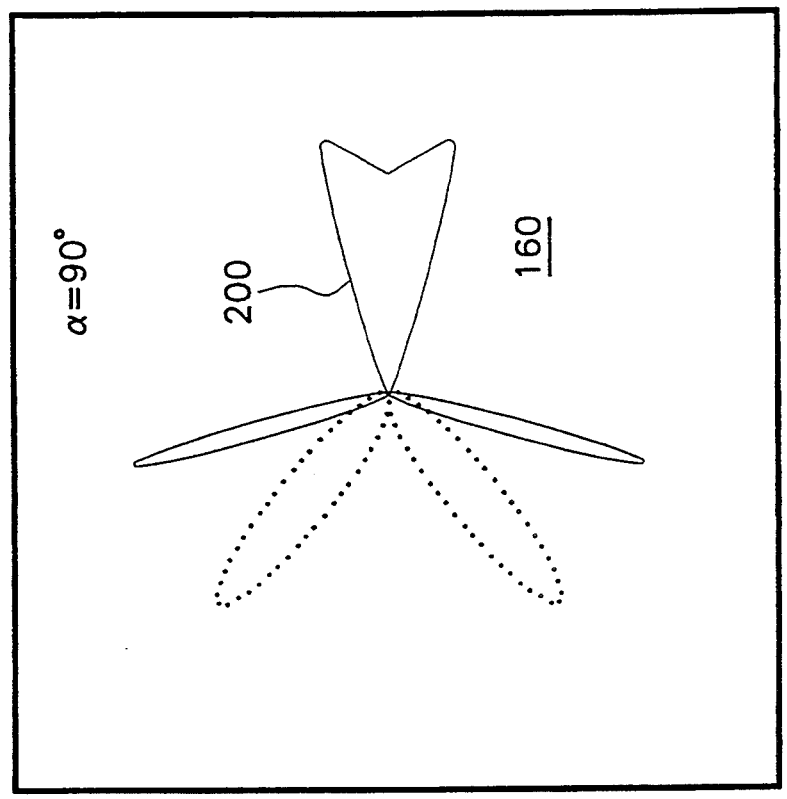
Figure 5F:
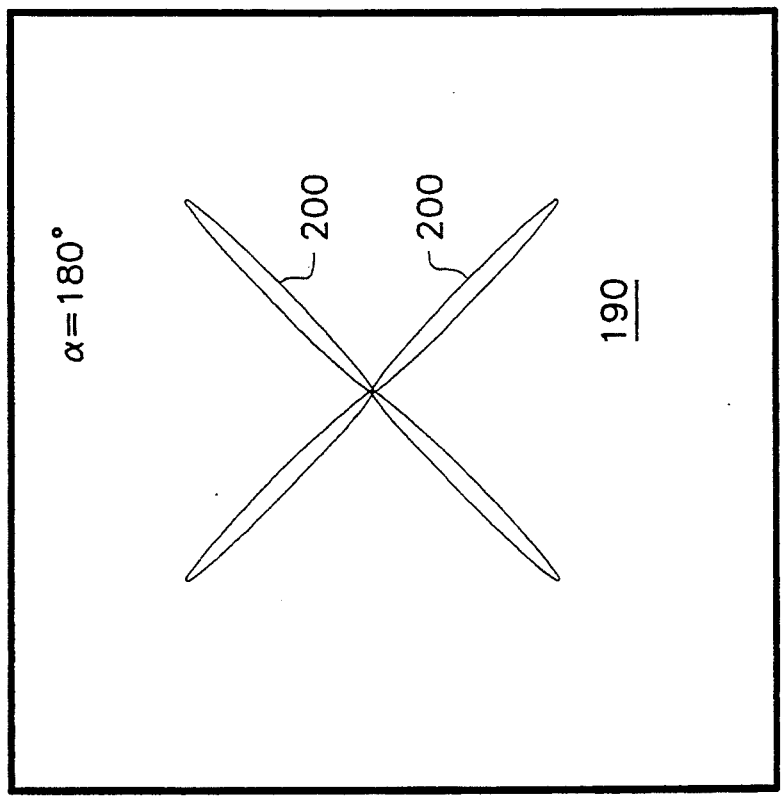
Figure 5E:
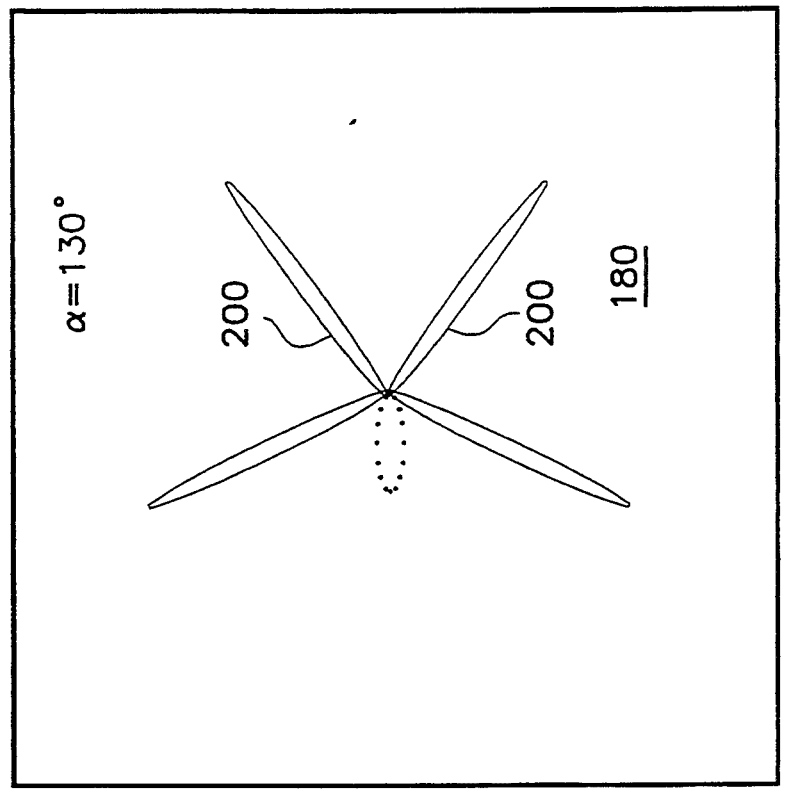

Referring to FIG. 4, a distributed source antenna array 90 which is comprised of a linear array of dipoles N or other radiating elements 100 embedded in chiral media spaced a distance d apart along the x axis. Since there is an inherent geometrical spacing which defines the array 90, the two eigenmodes of the medium will "see" an array of differing effective geometry, i.e., spacing and total length. The case of a linear array of dipoles is shown in FIG. 3 where N elements are spaced a distance d apart along the x axis. The phase shift per element (in free space) is taken to be $\alpha$. Equation (24) produces the eigenmode expressions for the far-zone electric field as:

$$E(x)_\pm \underset{kr \gg 1}{=>} = \omega^2\mu \underline{\Gamma}^\pm(x,0) \cdot [p \pm im/v_c]AF_\pm \tag{31}$$

where the angular dependance of the array factor $AF_\pm$ is given by $$AF_\pm = \frac{\sin\left[\frac{N}{2}(k_\pm d\cos\Omega + \alpha)\right]}{\sin\left[\frac{1}{2}(k_\pm d\cos\Omega + \alpha)\right]} \tag{32}$$

and where $\Omega$ is the angle between the array axis (x axis in this exemplary case) and the position vector 120 of the observer 130. Here both eigenmodes play an important role except for the special case of $\pm p = im/v_c$ when only one of the eigenmodes is excited as noted above.

Consider the case when dipoles 100 are strictly electric dipoles given by $p = p\ e_z$. The total electric field is found to be:

$$E(x) \underset{kr \gg 1}{=>} -\sqrt{2}\ \omega^2\mu p \sin\theta \left\{ [\beta]\frac{e^{ik+r}}{4\pi r}AF_+\hat{e}_+ + [1-\beta]\frac{e^{ik-r}}{4\pi r} AF_+\hat{e}_- \right\} \tag{33}$$

which an elliptically polarized wave (combined from the two circular eigenmodes) at broadside but for non-zero phase shifts, can also exhibit two beams of opposite handedness.

Referring to FIG. 5, the far zone radiation pattern of electric field (33) for an array of preferably fifteen elements (N=15), spaced a half-wavelength apart ($k_0 d = \pi$) is shown. The phase shift $\alpha$ is varied from broadside ($\alpha = 0$) to increasing values to illustrate beam splitting. Beam splitting occurs when the main lobes of the two eigenmodes have the same first null and are not overlapping. The criterion for beam splitting is:

$$N|\alpha| = 2\pi/\kappa. \tag{34}$$

This indicates that for values of $N|\alpha|$ larger than those of (34), the array exhibits two distinct main beams, each circularly polarized with opposite handedness.

Degrees of beam separation for six exemplary values of phase shift $\alpha$ with positive chiral admittance $\xi_c$ are shown. The broadside case, $\alpha = 0$ shown generally at 140 illustrates complete beam overlap when the elements are fed in phase. Then the phase shift is increased to satisfy Equation (34), phase shift until condition (34) is met in part b). As the phase shift is increased, $\alpha = 90°$, $\alpha = 115°$, $\alpha = 130°$, $\alpha = 180°$, respectively 160, 170, 180 and 190, grating lobes 200 appear. In the limit as $\alpha' 180°$, generally at 190, almost all of the beam energy in the negative eigenmode vanishes and is converted to the positive eigenmode. This is generally noted "beam suppression" and is of interest when it is desired to use the antenna array of FIG. 4 as a source of circular polarization.

The canonical cases discussed above are of practical interest in a variety of problems. In preferred embodiments, chiral antennas provided in accordance with this invention may comprise chiral radomes. In further preferred embodiments, chiral antennas provided in accordance with this invention may comprise lenses of chiral material which focus electromagnetic waves on conventional antennas, antenna arrays, waveguide antennas, horn antennas or Dielectric antennas. The results given here for unbounded chiral media in preferred embodiments provide an upper bound or first-order approximation for the effect of finite non-resonant chiral slabs.

Figure 6:
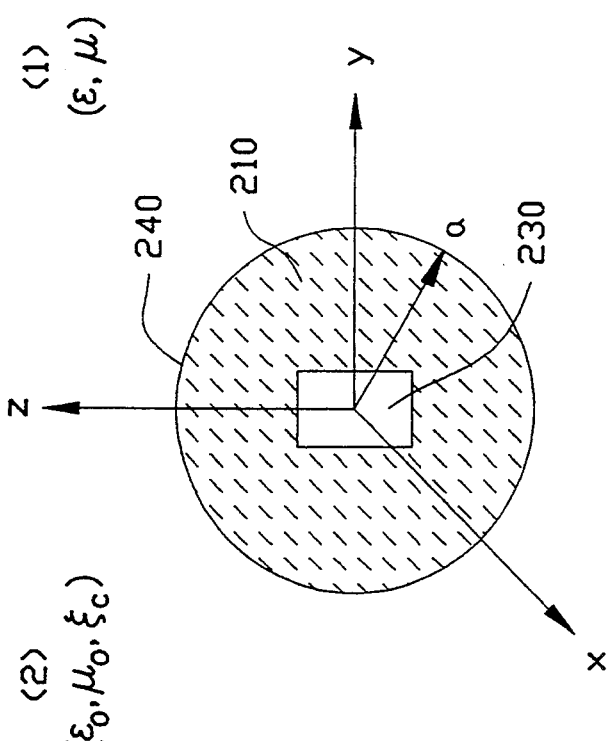
FIG. 6 is a spherical chiral radome covering an antenna element.

Derivation of the Dyadic Green's Function for a Source interior to a Chiral Sphere: Radome Design The geometry of interest is shown in FIG. 6. It consists of a chiral sphere 210 of radius $a$ located at the origin and embedded in a nonchiral dielectric 220 of infinite extent. As depicted in FIG. 6, the exterior 220 and interior of the chiral sphere are denoted regions 1 and 2, respectively. Since the dyadic Green's function for sources in region 1 is different from that for sources in region 2, the two cases are considered separately. Here, the case where the source 230 is at the interior of the sphere is examined.

The boundary conditions require that the total tangential components of E and H be continuous across the interface 240:

$$e_r \times E_1 = e_r \times E_2 \quad (35)$$

$$e_r \times H_1 = e_r \times H_2 \quad (36)$$

where $E_1$ and $H_1$ are the fields in region 1 and $E_2$ and $H_2$ are those in region 2. The electric fields can be written as:

$$E_1(r) = i\omega\mu_c \int \underline{\Gamma}_{tot}^{(12)}(r,r') \cdot J_2(r') \, dV' \quad (37)$$

and $$E_2(r) = i\omega\mu_c \int \underline{\Gamma}_{tot}^{(22)}(r,r') \cdot J_2(r') dV' \quad (38)$$

The first superscript of the dyadic indicates the location of the observation point, while the second gives that of the source. With the electric field representation in Eqns. (37) and (38), boundary condition (35) at $r=a$ becomes $$e_r \times \underline{\Gamma}_{tot}^{(12)}(r,r') = e_r \underline{\Gamma}_{tot}^{(22)}(r,r') \quad (39)$$

In order to express boundary condition (36) in terms of these same functions, replace H by E with the help of the appropriate constitutive relation and Maxwell's equation $\nabla \times E = i\omega B$, which yields:

$$\frac{1}{\mu}[e_r \times \nabla \times \underline{\Gamma}_{tot}^{(12)}(r,r')] = -\omega\xi_c[e_r \times \underline{\Gamma}_{tot}^{(22)}(r,r')] + \quad (40)$$

$$\frac{1}{\mu_c}[e_r \times \nabla \times \underline{\Gamma}_{tot}^{(22)}(r,r')]$$

From scattering superposition, the total dyadic Green's functions in (37) and (38) may be written as:

$$\underline{\Gamma}_{tot}^{(12)}(r,r') = \underline{\Gamma}_s^{(12)}(r,r') \quad r \geq a \quad (41)$$

$$\underline{\Gamma}_{tot}^{(22)}(r,r') = \underline{\Gamma}_c(r,r') + \underline{\Gamma}_s^{(>)}(r,r') \quad r \geq a \quad (42)$$

where good choices for the forms of $\underline{\Gamma}_s^{(12)}(r,r')$ and $\underline{\Gamma}_s^{(22)}(r,r')$ are:

$$\underline{\Gamma}_s^{(12)}(r,r') = \frac{i}{2\pi(k_+ + k_-)} \sum_{n=1}^{\infty} \sum_{m=0}^{n} (2 - \delta_{m0}) \frac{(2n+1)(n-m)!}{n(n+1)(n+m)!} \quad (43a)$$

$$\{[a_n{}^v V_{\substack{emn \\ o}}^{(1)}(k) + a_n{}^w W_{\substack{emn \\ o}}^{(1)}(k)] V_{\substack{emn \\ o}}(k_+) + [b_n{}^v V_{\substack{emn \\ o}}^{(1)}(k) + b_n{}^w W_{\substack{emn \\ o}}^{(1)}(k)] W_{\substack{emn \\ o}}(k_-)\}$$

and $$\underline{\Gamma}_s^{(22)}(r,r') = \frac{i}{2\pi(k_+ + k_-)} \sum_{n=1}^{\infty} \sum_{m=0}^{n} (2 - \delta_{m0}) \frac{(2n+1)(n-m)!}{n(n+1)(n+m)!} \quad (43b)$$

$$\{[c_n{}^v V_{\substack{emn \\ o}}(k_+) + c_n{}^w W_{\substack{emn \\ o}}(k_-)] V_{\substack{emn \\ o}}(k_+) + [d_n{}^v V_{\substack{emn \\ o}}(k_+) + d_n{}^w W_{\substack{emn \\ o}}(k_-)] W_{\substack{emn \\ o}}(k_-)\}.$$

Here, $$V_{\substack{emn \\ o}}(\kappa) = \frac{M_{\substack{emn \\ o}}(\kappa) + N_{\substack{emn \\ o}}(\kappa)}{\sqrt{2}} = \frac{1}{\sqrt{2}}\left[\mp \frac{m}{\sin\theta} P_n{}^m(\cos\theta) \frac{\sin}{\cos}(m\phi)\left(j_n(\kappa r)e_\theta + \frac{1}{\kappa r}\frac{\partial}{\partial r}[rj_n(\kappa r)]e_\phi\right)+ \right. \quad (44)$$

$$\left. \frac{\partial P_n{}^m(\cos\theta)}{\partial\theta}\frac{\cos}{\sin}(m\phi)\left(\frac{1}{\kappa r}\frac{\partial}{\partial r}[rj_n(\kappa r)]e_\theta - j_n(\kappa r)e_\phi\right) + n(n+1)P_n{}^m(\cos\theta)\frac{\cos}{\sin}(m\phi)\frac{j_n(\kappa r)}{\kappa r}e_r\right]$$

and $$W_{\substack{emn \\ o}}(\kappa) = \frac{M_{\substack{emn \\ o}}(\kappa) - N_{\substack{emn \\ o}}(\kappa)}{\sqrt{2}} = \frac{1}{\sqrt{2}}\left[\mp \frac{m}{\sin\theta} P_n{}^m(\cos\theta) \frac{\sin}{\cos}(m\phi)\left(j_n(\kappa r)e_\theta - \frac{1}{\kappa r}\frac{\partial}{\partial r}[rj_n(\kappa r)]e_\phi\right)+ \right. \quad (45)$$

$$\left. \frac{\partial P_n{}^m(\cos\theta)}{\partial\theta}\frac{\cos}{\sin}(m\phi)\left(-\frac{1}{\kappa r}\frac{\partial}{\partial r}[rj_n(\kappa r)]e_\theta - j_n(\kappa r)e_\phi\right) - n(n+1)P_n{}^m(\cos\theta)\frac{\cos}{\sin}(m\phi)\frac{j_n(\kappa r)}{\kappa r}e_r\right]$$

where $\delta_{ij}$ is the Kronecker delta, $j_n(\kappa r)$ is a spherical Bessel function with order n and $P_n{}^m(\cos\theta)$ is an associated Legendre function of the first kind with order (n,m). Only integer values of n and m will be used herein. It should also be noted that the subscripts e and o do not refer to the nature of $Mc_{omn}(\kappa)$ or $Nc_{omn}(\kappa)$, but rather to the even or odd character of the generating function. The coordinates $(r, \theta, \phi)$, with their corresponding unit vectors, are standard spherical coordinates readily understood by those with skill in the art. When unprimed (primed), these coordinates represent the location of the observation (source) point.

Furthermore, as is required to matches $\underline{\Gamma}_s^{(12)}(r,r')$ and $\underline{\Gamma}_s^{(22)}(r,r')$ with $\underline{\Gamma}_c(r,r')$ at the boundary, the arguments of the primed spherical vector wave functions agree with those for $\underline{\underline{\Gamma}}_c(r,r')$. Also, here, four unknowns are present in each of (43a) and (43b). In general it is not possible to satisfy these conditions separately with each eigenmode, which explains why different coefficients are needed for $Ve_{omn}$ and $We_{omn}$.

Now, all that remains to be done is to solve for the unknown coefficients $a_n^v$, $a_n^w$, $b_n^v$, $b_n^w$, $C_n^w$, $C_n^w$, $d_n^w$. The following simplifying notation is introduced for this task:

$$j = j_n(ka) \quad \text{and} \quad \partial j = \frac{1}{ka} \left. \frac{\partial}{\partial r}[rj_n(kr)] \right|_a$$

$$j_\pm = j_n(k_\pm a) \quad \text{and} \quad \partial j_\pm = \frac{1}{k_\pm a} \left. \frac{\partial}{\partial r}[rj_n(k_\pm r)] \right|_a$$

$$h = h_n^{(1)}(ka) \quad \text{and} \quad \partial h = \frac{1}{ka} \left. \frac{\partial}{\partial r}[rh_n^{(1)}(kr)] \right|_a$$

$$h_\pm = h_n^{(1)}g(k_\pm a) \quad \text{and} \quad \partial h_\pm = \frac{1}{k_\pm a} \left. \frac{\partial}{\partial r}[rh_n^{(1)}(k_\pm r)] \right|_a$$

Substituting (43a) and (43b) into Eqns. (39) and (40), yields the following sets of linear relations:

$$\underline{\underline{T}} \begin{bmatrix} a_n^v \\ a_n^w \\ c_n^v \\ c_n^w \end{bmatrix} = \begin{bmatrix} k_+^2 \partial h_+ \\ k_+^2 h_+ \\ k_+^2 \partial h_+ \\ k_+^2 h_+ \end{bmatrix} \quad (46)$$

and $$\underline{\underline{T}} \begin{bmatrix} b_n^v \\ b_n^w \\ d_n^v \\ d_n^w \end{bmatrix} = \begin{bmatrix} -k_-^2 \partial h_- \\ k_-^2 h_- \\ k_-^2 \partial h_- \\ -k_-^2 h_- \end{bmatrix} \quad (47)$$

with the matrix T given by $$\underline{\underline{T}} = \begin{bmatrix} \partial h & -\partial h & -\partial j_+ & \partial j_- \\ h & h & -j_+ & -j_- \\ l\partial h & l\partial h & -\partial j_+ & -\partial j_- \\ lh & -lh & -j_+ & j_- \end{bmatrix} \quad (48)$$

and where l, the impedance ratio between the sphere's interior and its exterior, is $$l = \frac{\sqrt{\epsilon/\mu}}{\sqrt{\xi_c^2 + (\epsilon_c/\mu_c)}} \quad (49)$$

The inverse of $\underline{\underline{T}}$, can be found by Gaussian-Jordan elimination. However, because of the tediousness of the task, the MATHEMATICA ™ computer mathematics software package developed by Stephen Wolfram, Inc., Urbana, Ill. yields the following result:

$$\underline{\underline{T}}^{-1} = \frac{1}{2D} \begin{bmatrix} t_{11} & t_{12} & t_{13} & t_{14} \\ t_{21} & t_{22} & t_{23} & t_{24} \\ t_{31} & t_{32} & t_{33} & t_{34} \\ t_{41} & t_{42} & t_{43} & t_{44} \end{bmatrix} \quad (50)$$

with $t_{11} = (l-1)j_- \partial j_+ h - (l+1)j_+ \partial j_- h + 2lj_+ j_- \partial h$
$t_{12} = -(l+1)j_- \partial j_+ \partial h + (l-1)j_+ \partial j_- \partial h + 2l\partial j_+ \partial j_- h$
$t_{13} = -(l-1)j_- \partial j_+ h - (l+1)j_+ \partial j_- h + 2j_{30} j_- \partial h$
$t_{14} = -(l+1)j_- \partial j_+ \partial h - (l-1)j_+ \partial j_- \partial h + 2\partial j_+ \partial h$
$t_{21} = (l+1)j_- \partial j_+ h - (l-1)j_+ \partial j_- h - 2lj_+ j_- \partial h$
$t_{22} = (l-1)j_- \partial j_{30} \partial h - (l+1)j_+ \partial j_- \partial h + 2lj_{30} \partial j_- h$
$t_{23} = -(l+1)j_- \partial j_+ h - (l-1)j_+ \partial j_- h + 2j_+ j_- \partial h$
$t_{24} = (l-1)j_- \partial j_+ \partial h + (l+1)j_+ \partial j_- \partial h - 2\partial j_+ \partial j_- h$
$t_{31} = -2l\partial j_- h^2 + 2l^2 j_- h\partial h$
$t_{32} = -2lj_- \partial h^2 + 2l^2 \partial j_- h\partial h$
$t_{33} = -2l\partial j_- h^2 + 2j_- h\partial h$
$t_{34} = -2lj_- \partial h^2 + 2\partial j_- h\partial h$
$t_{41} = 2l\partial j_+ h^2 - 2l^2 j_+ h\partial h$
$t_{42} = -2lj_+ \partial h^2 + 2l^2 j_{30} h\partial h$
$t_{43} = -2l\partial j_+ h^2 + 2j_+ h\partial h$
$t_{44} = 2lj_+ \partial h^2 - 2\partial j_+ h\partial h$ and $$D = 2l[h^2 \partial j_+ \partial j_- - \partial h^2 j_+ j_-] - h\partial h(l^2+1)(j_+ \partial j_- + j_- \partial j_+) \quad (51)$$

Hence, the coefficients of the dyadic Green's functions for sources at the interior of the chiral sphere are $$a_n^v = k_+^2(l+1)(j_- \partial h - \partial j_- h)(j_+ \partial h_+ - \partial j_+ h_+)/D \quad (52)$$

$$a_n^w = -k_+^2(l-1)(j_- \partial h + \partial j_- h)(j_+ \partial h_+ - \partial j_+ h_+)/D \quad (53)$$

$$b_n^v = -k_-^2(l-1)(j_+ \partial h + \partial j_+ h)(j_- \partial h_- - \partial j_- h_-)/D \quad (54)$$

$$b_n^w = k_-^2(l+1)(j_+ \partial h - \partial j_+ h)(j_- \partial h_- - \partial j_- h_-)/D \quad (55)$$

$$c_n^v = k_+^2[(l^2+1)h\partial h(j_- \partial h_+ + \partial j_- h_+) \\ -2l(j_- h_+ \partial h^2 + \partial j_- \partial h_+ h^2)]/D \quad (56)$$

$$c_n^w = -k_+^2(l^2-1)h\partial h(j_+ \partial h_+ - \partial j_+ - \partial j_+ h_+)/D \quad (57)$$

$$d_n^v = -k_-^2(l^2-1)h\partial h(j_- \partial h_- - \partial j_- h_-)/D \quad (58)$$

$$d_n^w = k_-^2[(l^2+1)h\partial h(j_+ \partial h_- + \partial j_+ h_-) \\ -2l(j_+ h_- \partial h^2 + \partial j_+ \partial h - h^2)]/D \quad (59)$$

Substituting the coefficients (52) through (59) into Eqns. (43a) and (43b), the complete expression of the dyadic Green's function for electromagnetic sources at the interior of the chiral sphere is obtained.

Application of the Interior Dyadic Green's Functions to a Radiating Dipole

In a preferred embodiment, the radiation pattern from tm electric dipole source at the center of a chiral sphere may be derived: The current distribution $J_2(r')$ is again given by:

$$J_2(r') = e_r \frac{I_o \delta(r')\delta(\theta')\delta(\phi')}{r'^2 \sin\theta'} \quad (60)$$

Inserting this distribution and 43a into Eqn. (37), yields:

$$E_1(r) = -\frac{\omega\mu_c I_o}{2\sqrt{2}(k_+ + k_-)} [\{a_1{}^v - b_1{}^v\} \, W^{(1)}_{\omega 01}(k) + \tag{61}$$

$$\{a_1{}^w - b_1{}^w\} \, W^{(1)}_{\omega 01}(k)]$$

For the far field, i.e., $kr \gg 1$, (61) reduces to $$E_1(r) = -\frac{i\omega\mu_c I_o \sin\theta}{4\pi(k_+ + k_-)} \frac{e^{ikr}}{kr} [\{a_1{}^v - b_1{}^v\}(e_\theta + ie_\phi) + \tag{62}$$

$$\{b_1{}^w - a_1{}^w\}(e_\theta - ie_\phi)]$$

Limiting this expression to large spheres, for which:

$$j_\pm \underset{k_\pm a \gg 1}{\Longrightarrow} -\frac{\cos(k_\pm a)}{k_\pm a} \tag{63}$$

$$\partial j_\pm \underset{k_\pm a \gg 1}{\Longrightarrow} \frac{\sin(k_\pm a)}{k_\pm a} \tag{64}$$

$$h_\pm \underset{k_\pm a \gg 1}{\Longrightarrow} -\frac{e^{ik_\pm a}}{k_\pm a} \tag{65}$$

$$\partial h_\pm \underset{k_\pm a \gg 1}{\Longrightarrow} -i\frac{e^{ik_\pm a}}{k_\pm a}, \tag{66}$$

Eqn. (62) thus becomes:

$$E_1(r) = -\frac{i\omega\mu_c I_o \sin\theta}{4\pi(k_+ + k_-)} \frac{e^{ik(r-a)}}{r} \frac{[\lambda_+(e_\theta + ie_\phi) + \lambda_-(e_\theta - ie_\phi)]}{2l\cos[(k_+ + k_-)a] - i(l^2 + 1)\sin[(k_+ + k_-)a]} \tag{67}$$

where $$\lambda_+ = k_+(l+1)e^{-ik_-a} + k_-(l-1)e^{ik_+a} \tag{68}$$

$$\lambda_- = k_-(l+1)e^{-ik_+a} + k_+(l-1)e^{ik_-a}. \tag{69}$$

It is worth noting, that due to the geometry of the problem, the angular dependence of the dipole's radiated fields are similar to those of a dipole in an unbounded chiral or nonchiral medium.

The total radiated power P is given by:

$$P = \tfrac{1}{2} \text{Re} \int n \cdot (E_1 \times H_1{}^*) dS. \tag{70}$$

Since, outside tile sphere, the ratio of the electric field to the magnetic field in the far zone is $\sqrt{\mu/\epsilon}$, this may be written in terms of the $\theta$ and $\phi$ components of the electric field as:

$$P = \frac{1}{2\sqrt{\mu/\epsilon}} \int (|E_\theta|^2 + |E_\phi|^2) r^2 \sin\theta \, d\theta \, d\phi \tag{71}$$

Substituting (67) into this relation and performing tile integration yields:

$$P = \frac{\omega^2 \mu_c{}^2 I_o{}^2}{3\pi\sqrt{\mu/\epsilon}(k_+ + k_-)^2} \frac{(k_+{}^2 + k_-{}^2)(l^2 + 1) + 2k_+k_-(l^2 - 1)\cos[(k_+ + k_-)a]}{4l^2\cos^2[(k_+ + k_-)a] + (l^2 + 1)^2\sin^2[(k_+ + k_-)a]} \tag{72}$$

Figure 7:
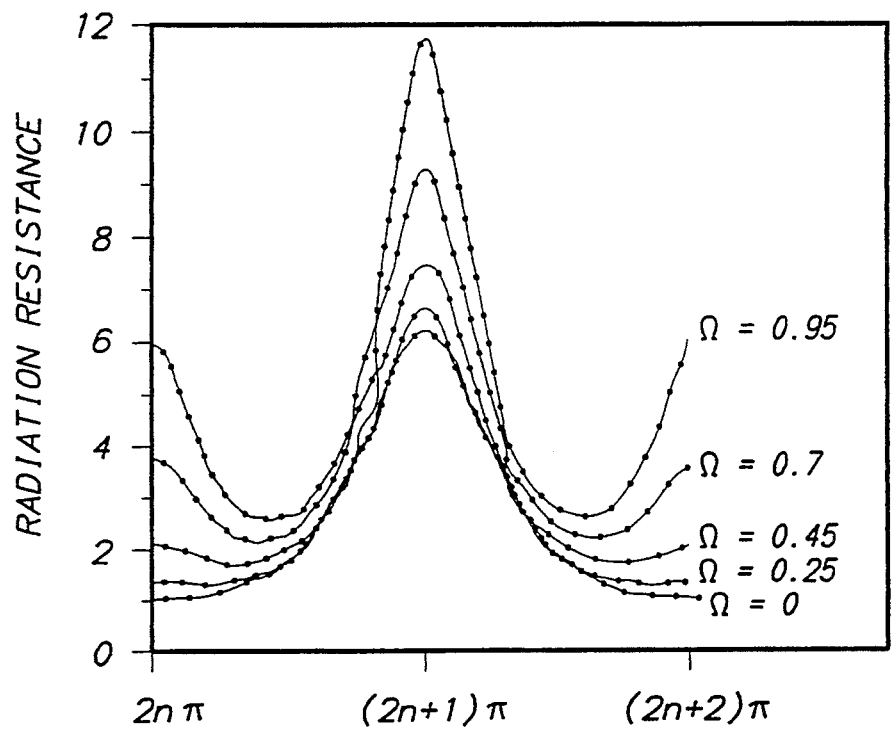
FIG. 7 is a plot normalized radiation resistance of the antenna structure of FIG. 6.

Therefore, tile radiation resistance is $$R = \frac{2\omega^2 \mu_c{}^2 \Delta^2}{3\pi\sqrt{\mu/\epsilon}(k_+ + k_-)^2} \frac{(k_+{}^2 + k_-{}^2)(l^2 + 1) + 2k_+k_-(l^2 - 1)\cos[(k_+ + k_-)a]}{4l^2\cos^2[(k_+ + k_-)a] + (l^2 + 1)^2\sin^2[(k_+ + k_-)a]}, \tag{73}$$

since $P = I^2 R/2$. The graph of Eqn. (73) as a function of $(k_{30} + k)a$ is shown in FIG. 7 for $\epsilon/\epsilon_c = 0.16$. Two notable effects are seen in the graph: the first is the strong resonance that occurs when $(k_+ + k)a$ is an odd multiple of $\pi$ and the second is the increase in radiation resistance due to increased chirality. The former effect is simply a result of constructive interference occurring within the sphere. The second one enters into the problem by changing both file impedance of the sphere and the radiation characteristics of the dipole, i.e., by exciting the RCP mode more strongly than the LCP mode.

Using the standard representation for file Poincaresphere as known by those with skill in tile art, the polarization of a point on the Poincarésphere with latitude $2\chi$ may be expressed as:

$$\sin 2\chi = \frac{|\lambda_-|^2 - |\lambda_+|^2}{|\lambda_-|^2 + |\lambda_+|^2} = \tag{74}$$

$$-\frac{2(k_+{}^2 - k_-{}^2)l}{(k_+{}^2 + k_-{}^2)(l^2 + 1) + 2k_+k_-(l^2 - 1)\cos[(k_+ + k_-)a]},$$

since $$|\lambda_\pm|^2 = k_\pm{}^2(l+1)^2 + k_\mp{}^2(l-1)^2 + 2k_+k_-(l^2-1)\cos[(k_++k_-)a]. \tag{75}$$

For right hand elliptically polarized waves $-1 < \sin 2\chi < 0$, whereas for left hand elliptically polarized waves $0 < \sin 2\chi < 1$. At the extremes, $\sin 2\chi = -1$ and $\sin 2\chi 1$, the waves are RCP and LCP, respectively. Furthermore, when $\sin 2\chi = 0$ the polarization is linear. Therefore, it follows from Eqns. (74), that for positive (negative) $\xi_c$ the radiated field is always of fight (left) handed polarization. A plot of Eqn. (74) is found in FIG. 8 for several values of positive $\xi_c$.

Figure 8:
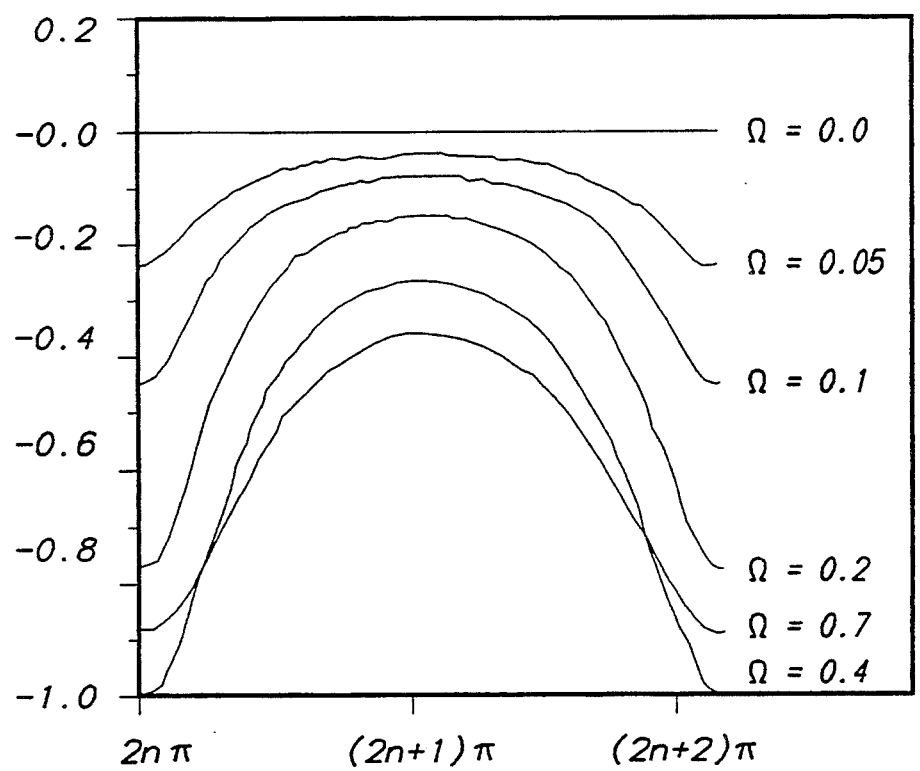
FIG. 8 is a plot of the ellipticity of the polarization ellipse of the radiated field of antenna structures FIG. 6.

It is evident from FIG. 8 that, when $(k_+ + k_-)a$ is an even multiple of $\pi$, one may achieve complete right circular polarization. The physical conditions which permit this phenomenon are of particular interest to radome design. To examine these conditions, we must seek the roots of Eqn. (75) or, in a more intuitive form, of:

$$k_\mp{}^2 R^2 - 2k_+k_- \cos[(k_+ + l_-)a]R + k_\pm{}^2 = 0 \tag{76}$$

where the reflection coefficient $R = -(l-1)/(l+1)$. The solution of (76):

$$R = \frac{k_\pm}{k_\mp} \{\cos[(k_+ + k_-)a] \pm \sqrt{-\sin^2[(k_+ + k_-)a]}\} \quad (77)$$

which requires that $(k_+ + k_-)a = n\pi$ in order to have real values for R. Therefore, for $|\lambda_+|^2 = 0$ $$R = \begin{cases} k_+/k_- & n \text{ even} \\ -k_+/k_- & n \text{ odd} \end{cases} \quad (78)$$

and for $|\lambda_-|^2 = 0$ $$R = \begin{cases} k_-/k_+ & n \text{ even} \\ -k_-/k_+ & n \text{ odd.} \end{cases} \quad (79)$$

However, since $\xi_c$ is fixed at a particular value, it is only possible to satisfy one of the two equations in a given medium. We can suppress the LCP wave only when $\xi_c$ is positive and the RCP wave only when it is negative. Physically, the elimination of one of the modes, let us say the LCP mode, may be explained as follows. When Condition (79) is satisfied, a fraction $k_-/k_{30}$ of the RCP wave is reflected at the sphere's boundary and becomes an LCP wave. This latter wave now has the same magnitude as the original LCP wave since, for an unbounded chiral medium, the ratio of the amplitude of the RCP mode to that of the LCP mode is $k_+/k_-$. If the latter wave is 180 degrees out of phase with the original LCP wave radiated by the source, the LCP mode is completely cancelled. Furthermore, as the chirality progressively increases, a smaller and smaller portion of the RCP mode is needed for the cancellation, which results in the greater radiation efficiency seen in FIG. 37.

The effects of matching the sphere's impedance to that of the surrounding medium, that is the case where $l = 1$ is next considered in a preferred embodiment. In this case Eqn. (67) then simplifies to $$E_1(r) = -\frac{i\omega\mu_c I_0 \sin\theta}{4\pi(k_+ + k_-)} \frac{e^{ik(r-a)}}{r} [k_+ e^{ik_+ a}(e_\theta + ie_\phi) + \\ k_- e^{ik_- a}(e_\theta - ie_\phi)], \quad (80)$$

It must be noted that due to the impedance matching offered by $l = 1$, the above radiation resistance is independent of the sphere's radius.

Referring again to FIG. 6, a preferred embodiment of an antenna structure is shown. The antenna structure comprises a radome further comprising a chiral medium shown generally at 210. The radome 210 preferably has a finite volume and an antenna element 230, generally as described above, is substantially embedded within the finite volume of the radome 210. In further preferred embodiments the chiral radome 210 is any three-dimensional structure having a finite volume, for example, a sphere, a cube, a hemisphere, an ellipsoid, a pyramid, or any other finite size three-dimensional body. All such structures and equivalents thereof are intended to be within the scope of the present invention.

Figure 9:
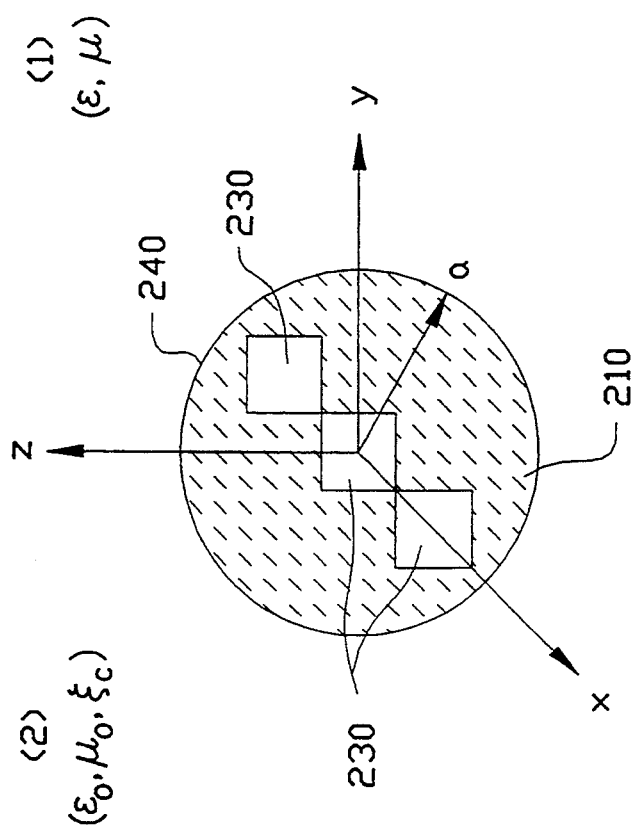
FIG. 9 is a preferred embodiment of an antenna structure provided in accordance with the present invention comprise a chiral radome and a plurality of antenna elements.

Referring to FIG. 9, yet a further preferred embodiment of antenna structures provided in accordance with the present invention is shown. In this embodiment, a plurality of antenna elements 230 are embedded in chiral radome 210. The antenna elements 230 may be as described previously, for example, turnstile antenna elements, magnetic or electric dipoles, horn antennas, or other receiving and transmitting antenna elements. As the spherical radome 210 approaches an infinitely large volume as compared to the wavelength of electromagnetic energy interacting with antenna elements 230, the radiation pattern approaches the pattern as substantially illustrated in FIG. 5 in preferred embodiments.

Figure 10D:
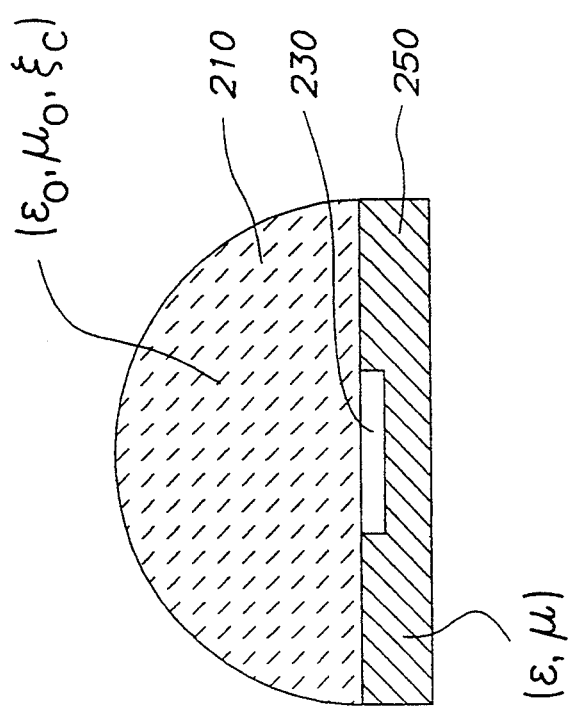

In still further preferred embodiments, the antenna structures as shown in FIGS. 10a and 10d are described. A dielectric substrate 250 having material parameters $\epsilon$, $\mu$ provides a non-chiral substrate to the structure. An antenna element 230 is interfaced with the nonchiral dielectric substrate 250 such that the substrate 250 holds the antenna element 230 in a substantially fixed position. Preferably, a radome 210 comprising a chiral medium is further interfaced with antenna element 230 and provides a cover for the antenna element. In still further preferred embodiments, the chiral radome 210 is a substantially hemispherical finite volume of chiral material.

Referring to FIG. 10b, a dielectric non-chiral layer 250 also provides a substrate to the antenna structure. In a preferred embodiment, a plurality of antenna elements 230 may be interfaced with the dielectric substrate and a radome may further comprise a plurality of chiral layers 260 and 270 having different chiral parameters $(\epsilon_1, \mu_1, \xi_{c1})$ and $(\epsilon_2, \mu_2, \xi_{c2})$. A ground plane 280 is interfaced with the non-chiral dielectric layer 250 in preferred embodiments and is provided to both ground the antenna structure and to hold the antenna structure in a preferred orientation. The ground plane 280 may be, for example, the body of an aircraft when the antenna structure is fixed to an aircraft or, more generally, is any conducting ground structure. It may also be a conducting metal ground plate provided specifically for an antenna structure as shown in FIG. 10b.

In still further preferred embodiments of antenna structures provided in accordance with the present invention, an antenna element 230 may be embedded in a radome shell 290 as shown in FIG. 10c. Radome shell 290 preferably has a finite volume and further comprises a chiral medium such that the antenna element is embedded in radome chiral shell 290 in a substantially non-chiral portion 300 of the radome shell. The non-chiral portion 300 could be a dielectric material, or alternately, is simply an airspace which also exhibits certain dielectric properties. In still further preferred embodiments, a plurality of non-chiral layers such as dielectrics could be interfaced with a plurality of chiral layers to provide radome structures in antenna structure configurations such as those shown in FIGS. 10b or 10e. Again, all such configurations and equivalents thereof are intended to be within the scope of the present invention.

With all antenna structures described and claimed herein, it is expected that the radiation resistance characteristics as illustrated in FIG. 7 for the chiral sphere radome will be achieved. It should be noted as shown in FIG. 7 that by introducing a chiral radome to a chiral structure in accordance with the present invention, the radiation resistance can be greatly increased as compared to a non-chiral radome structure depending on particular design parameters that are desired. While this is true for the single antenna element described in FIG. 6, having the particular shape of the curve shown in FIG. 7, by introducing a plurality of antenna elements the shape of the curve will change but increased radiation resistance is expected.

Another interesting and important aspect of antenna structures comprising chiral radomes provided in accordance with the present invention is the change of the state of polarization of the radiated field as compared with a non-chiral radome as illustrated in FIG. 8. As can be seen in this Figure, by introducing chirality in radome structure for the preferred embodiment in FIG. 6, the radiated field is elliptically polarized as opposed with non-chiral case. More specifically, as was described earlier, the circularly polarized radiated field can be achieved for the antenna structure in FIG. 6 depending on particular design parameters. Such features evince startlingly unexpected results not heretofore achieved in the antenna and radome art and solve long-felt needs for efficient and multipolarized antenna structures.

There have thus been described certain preferred embodiments of methods of constructing radomes of chiral materials and radomes comprising chiral materials. While preferred embodiments have been described and disclosed, it will be recognized by those with skill in the art that modifications are within the true spirit and scope of the invention.

The appended claims are intended to cover all such modifications.

What is claimed is:

1. An antenna structure comprising:
   at least one antenna element;
   a non-chiral dielectric substrate interfaced with the antenna element to hold the at least one antenna in a substantially fixed position in the antenna structure; and
   a radome further comprising a chiral medium interfaced with the at least one antenna element for covering the at least one antenna element.

2. The antenna structure recited in claim 1 further comprising a ground plane which comprises a conductor interfaced with the non-chiral dielectric substrate for grounding and holding the antenna structure.

3. The antenna structure recited in claim 1 wherein the radome comprises a substantially hemispherical finite volume of chiral material.

4. The antenna structure recited in claim 2 wherein the radome comprises a plurality of chiral layers.

5. An antenna structure comprising:
   at least one antenna element; and
   a radome shell having a finite volume which comprises a chiral medium and a non-chiral portion wherein the at least one antenna element is embedded at least partly in the non-chiral portion of the radome shell.

6. The antenna structure recited in claim 5 wherein the radome shell is substantially spherical.

7. The antenna structure recited in claim 5 wherein the radome shell is substantially hemispherical.

* * * * *